United States Patent
Hirota et al.

(10) Patent No.: US 10,551,664 B2
(45) Date of Patent: Feb. 4, 2020

(54) COLOR DISPLAY, LIQUID CRYSTAL DISPLAY, AND SEMI-TRANSMISSIVE LIQUID CRYSTAL DISPLAY

(71) Applicants: Japan Display Inc., Tokyo (JP); Panasonic Liquid Crystal Display Co., Ltd., Hyogo-ken (JP)

(72) Inventors: Shoichi Hirota, Hitachi (JP); Shinichi Komura, Mobara (JP); Yoshifumi Sekiguchi, Hitachiota (JP); Tsunenori Yamamoto, Hitachi (JP); Masaya Adachi, Hitachi (JP)

(73) Assignees: Japan Display Inc., Tokyo (JP); Panasonic Liquid Crystal Display Co., Ltd., Hyogo-ken (JP)

( * ) Notice: Subject to any disclaimer, the term of this patent is extended or adjusted under 35 U.S.C. 154(b) by 0 days.

(21) Appl. No.: 15/454,045

(22) Filed: Mar. 9, 2017

(65) Prior Publication Data
US 2017/0178577 A1    Jun. 22, 2017

Related U.S. Application Data

(63) Continuation of application No. 14/518,010, filed on Oct. 20, 2014, now Pat. No. 9,626,918, which is a
(Continued)

(30) Foreign Application Priority Data

Oct. 10, 2006 (JP) .................................. 2006-275967

(51) Int. Cl.
*G02F 1/1335* (2006.01)
*H01L 27/32* (2006.01)
(Continued)

(52) U.S. Cl.
CPC .. *G02F 1/133514* (2013.01); *G02F 1/134309* (2013.01); *G02F 1/136286* (2013.01);
(Continued)

(58) Field of Classification Search
CPC ......... G02F 1/133514; G02F 1/134309; G02F 1/134345; H01L 27/3218; H01L 27/3213; G09G 3/3607; G09G 2300/0452
See application file for complete search history.

(56) References Cited

U.S. PATENT DOCUMENTS

2003/0090581 A1* 5/2003 Credelle .................. G09G 3/20
348/273
2004/0178973 A1* 9/2004 Miller .................. G09G 3/3208
345/82
(Continued)

FOREIGN PATENT DOCUMENTS

CN    1588197 A    3/2005
JP    H10-319924 A    12/1998
(Continued)

OTHER PUBLICATIONS

Japanese Office Action dated Jan. 14, 2014 for corresponding Japanese Patent Application No. 2013-101198 with partial translation.
(Continued)

*Primary Examiner* — Jessica M Merlin
(74) *Attorney, Agent, or Firm* — Michael Best & Friedrich LLP

(57) ABSTRACT

In a color display device, when using white (W) sub-pixels in addition to subpixels of red (R) and green (G) plus blue (B) without increasing a wiring line number, the per-color pixel number in a unit area decreases so that the image resolution is deteriorated. The area and number of subpixels are adjusted in accordance with the visual sensitivity or
(Continued)

luminosity required. Practically, the area of red (R) and blue (B) subpixels which are relatively low in luminosity is set to be about two times greater than the area of green (G) and white (W) subpixels that are relatively high in luminosity while letting the number of green (G) and white (W) subpixels be twice the number of red (R) and blue (B) subpixels. A larger subpixel is configured from a plurality of unit subpixels. A smaller subpixel is formed of a one unit subpixel.

12 Claims, 10 Drawing Sheets

Related U.S. Application Data continuation of application No. 11/869,770, filed on Oct. 10, 2007, now Pat. No. 8,891,044.

(51) Int. Cl.
*G09G 3/36* (2006.01)
*G02F 1/1343* (2006.01)
*G02F 1/1362* (2006.01)
*G09G 3/20* (2006.01)

(52) U.S. Cl.
CPC ......... *G09G 3/2003* (2013.01); *G09G 3/3607* (2013.01); *G09G 3/3648* (2013.01); *H01L 27/3213* (2013.01); *H01L 27/3218* (2013.01); *G09G 3/2074* (2013.01); *G09G 2300/0452* (2013.01); *G09G 2300/0456* (2013.01); *G09G 2320/0219* (2013.01); *G09G 2320/0233* (2013.01); *G09G 2320/0276* (2013.01)

(56) References Cited

U.S. PATENT DOCUMENTS

| | | |
|---|---|---|
| 2005/0128413 A1 | 6/2005 | Son et al. |
| 2005/0225574 A1 | 10/2005 | Brown Elliott et al. |
| 2005/0225575 A1 | 10/2005 | Brown Elliott et al. |
| 2005/0237450 A1 | 10/2005 | Hu et al. |
| 2005/0270444 A1 | 12/2005 | Miller et al. |
| 2005/0270445 A1 | 12/2005 | Lee et al. |
| 2005/0275769 A1 | 12/2005 | Roh et al. |
| 2006/0139517 A1 | 6/2006 | Ahn et al. |
| 2006/0158467 A1 | 7/2006 | Larson et al. |

FOREIGN PATENT DOCUMENTS

| | | |
|---|---|---|
| JP | 11-295717 A | 10/1999 |
| JP | 2003-84719 A | 3/2003 |
| JP | 2003-157051 A | 5/2003 |
| JP | 2003-308048 A | 10/2003 |
| JP | 2004-53715 A | 2/2004 |
| JP | 2004-325716 A | 11/2004 |
| JP | 2005-284037 A | 10/2005 |
| JP | 2005-338783 A | 12/2005 |
| WO | 2005/122122 A1 | 12/2005 |

OTHER PUBLICATIONS

Chinese Office Action dated Oct. 31, 2008 for corresponding Chinese Patent Application 2007101801276.

* cited by examiner

COLOR DISPLAY, LIQUID CRYSTAL DISPLAY, AND SEMI-TRANSMISSIVE LIQUID CRYSTAL DISPLAY

CROSS REFERENCE TO RELATED APPLICATIONS CLAIM OF PRIORITY

This application is a continuation of U.S. application Ser. No. 14/518,010, filed on Oct. 20, 2014, which, in turn, is a continuation of U.S. application Ser. No. 11/869,770, filed on Oct. 10, 2007, now allowed, which claims the benefit of Japanese Application No. 2006-275967, filed on Oct. 10, 2006, in the Japanese Patent Office, the disclosures of which are incorporated herein by reference.

BACKGROUND OF THE INVENTION

The present invention relates to a color display device for displaying images, a liquid crystal display (LCD) device, and a semi-transmissive LCD device.

Currently available color display devices for use in practical applications include devices based on various kinds of display technologies, such as cathode ray tube (CRT) monitors, liquid crystal display (LCD) devices, plasma display panels (PDPs), organic light-emitting diode (LED) panels, field emission display (FED) panels, and electrophoresis or electrochrominance-based electronic paper ("e-paper") display panels. A major approach to achieving color image displaying in non-emissive LCDs is to use a technique for arranging a picture element or "pixel" by a parallel layout of sub-pixels having color filters of the three primary colors, i.e., red (R), green (G) and blue (B), and for adjusting the brightness of each subpixel independently of one another to thereby represent any given color by additive color mixture methods. Another approach for use with emissive displays is to arrange a pixel by parallel layout of subpixels having fluorescent materials of the three primary colors, i.e., red (R), green (G) and blue (B), and for adjusting the brightness on a per-subpixel basis in a similar way to LCDs to thereby represent any given color by additive color mixture methods in a similar way to LCDs.

In the case of the technique for performing color displaying by additive color mixture with the use of three-primary-color subpixels, it is possible to display on-screen images in vivid colors with high fidelity; on the contrary, as the area of each primary color-allocated subpixel is one third (⅓) the total area of a pixel, the resulting efficiency stays less, posing a problem as to deficiency of light amount.

One solution to this problem is to employ an arrangement with addition of subpixels of white (W) color, as proposed and disclosed in JP-A-11-295717. In the white (W) subpixels used in non-emissive LCDs, there is no light absorption at color filters so that it is possible to enhance the use efficiency of a light source. As the white (W) subpixels in emissive ones is high in brightness per unit area, it is easy to increase the brightness of display device.

In the case of adding the white (W) subpixels, if these subpixels are simply added, there exists a penalty as to unwanted increase in number of signal transmission lines and/or scanning lines. A pixel configuration with the white (W) subpixels being added thereto without having to increase the number of such lines is disclosed, for example, in U.S. Patent Application Publication No. 2005/0225575 A1.

Another problem of the additive color mixture-based color display scheme with the parallel layout of three-primary-color subpixels is that the color reproduction range is limited to within the zone of a triangle determined by chromaticity coordinate points of the three primary colors, resulting in a region being left widely, which is incapable of reproducing most of the real colors in the natural world. To solve this problem, an attempt is made to lay out subpixels of four primary colors to thereby expand the color reproduction range from the triangle to a rectangle.

An example of such four-primary-color display device is found in JP-A-2005-338783.

SUMMARY OF THE INVENTION

Although the addition of white (W) subpixels for reducing the color absorption loss due to color filters is effective, merely adding white (W) subpixels to red (R), green (G) and blue (B) subpixels causes a total number of subpixels to increase, resulting in an increase in number of electrical wiring lines associated therewith. When fixing this problem by use of the technique as taught by the above-cited US 2005/0225575A1, another problem arises as to a decrease in image resolution because of the fact that a per-color pixel number in the lateral direction is set to one-half of that of the parallel layout of extra-fine red (R), green (G) and blue (B) subpixels. In the case of ultrahigh-definition display devices with resolutions of more than 300 pixels per inch (ppi), this penalty is not so appreciable. However, in middle or high definition display devices with the resolution being set at 200 ppi, or more or less, the penalty appreciably degrades the viewability and visibility of on-screen color images. It is therefore an object of this invention to provide a display device capable of reducing the color filter-caused absorption loss while at the same time preventing reduction of image resolution.

Especially in the case of LCD devices, these are also required to reduce the loss occurring due to a black matrix which shields peripheral portions of subpixels in addition to the above-noted color filter-caused loss. Alternatively, in the case of LCD devices of the type employing a technique for driving a layer of liquid crystal (LC) material by use of a common electrode and comb-like signal electrode formed on the same substrate, a need is felt to provide a sufficiently long distance between an end portion of the comb-like signal electrode and a signal line in order to prevent occurrence of unwanted color mixture between neighboring subpixels, and thus these LCDs are under requirement for reduction of the loss occurrable due to the presence of such increased distance.

To attain the foregoing object, in accordance with one aspect of this invention, there is provided a color display device of the type having a matrix array of unit subpixel layouts which are comprised of a plurality of red (R), green (G), blue (B) and white (W) subpixels and performing color image display operations, characterized in that the subpixels are made different in area and number on a per-color basis while letting a total area of respective colors be kept unchanged and substantially equal.

More specifically, the red (R) and blue (B) subpixels are arranged to be about two times greater in area than the green (G) and white (W) subpixels. The green (G) and white (W) subpixels are two times greater in number than the red (R) and blue (B) subpixels. Those subpixels which are included in a pixel unit configuration that is a recurring unit are made up of an ensemble of twelve (12) subpixels in total, i.e., two red (R) subpixels, two blue (B) subpixels, four green (G) subpixels, and four white (W) subpixels.

Also importantly, each subpixel is constituted from one or a plurality of continuously disposed unit subpixels of the same area. Regarding the red (R) and blue (B) subpixels, each of these subpixels consists essentially of two unit subpixels. As for the green (G) and white (W) subpixels, each of them is formed of a single unit subpixel.

In accordance with another aspect of the invention, a color LCD device which is also capable of attaining the above-stated object is provided, which includes a color display device provided between two substrates to have a matrix array of rows and columns of unit subpixel layouts each being configured from a plurality of red (R), green (G), blue (B) and white (W) subpixels for performing color image displaying and a layer of LC material filled in a space gap between the substrates, characterized in that a black matrix is formed between the red (R) subpixels and green (G) subpixels and also between the blue (B) subpixels and green (G) subpixels whereas the black matrix is not formed between the red (R) subpixels and white (W) subpixels and between the blue (B) subpixels and white (W) subpixels.

Preferably in the color LCD device, specific layout design is employable for disposing a boundary of red and blue color filters between any one of the red (R) and blue (B) subpixels and a white (W) subpixel in such a manner that the boundary is closer to the white (W) subpixel side than a signal line between the red (R) and blue (B) subpixels on one hand and the white (W) subpixel on the other hand.

Alternatively, in order to attain the above-noted object in a color LCD device which has an LC layer filled in a gap space between two separate substrates with a color display device being provided therein, wherein this color display device has a matrix array of unit pixel layouts each being made up of a plurality of subpixels of red (R), green (G), blue (B) and white (W) for performing color display operations, this invention provides a color liquid crystal display device which is arranged so that in each subpixel the liquid crystal is driven by a comb-shaped signal electrode and common electrode provided on one substrate and which is characterized in that the distance between signal line and signal electrode end portion is changed in a color-dependent manner.

Further, in the color liquid crystal display device, it is recommendable to change the number of teeth of the comb-like signal electrode in a color-dependent way.

According to this invention, by adding white (W) pixels without having to increase the wiring line number, the loss occurring due to the presence of a color filter(s) is lessened to thereby make it possible to provide a display device with suppressibility of the image resolution reduction and also provide information terminal equipment using such the device.

Other objects, features and advantages of the invention will become apparent from the following description of the embodiments of the invention taken in conjunction with the accompanying drawings.

DETAILED DESCRIPTION OF THE INVENTION

Figure 1:
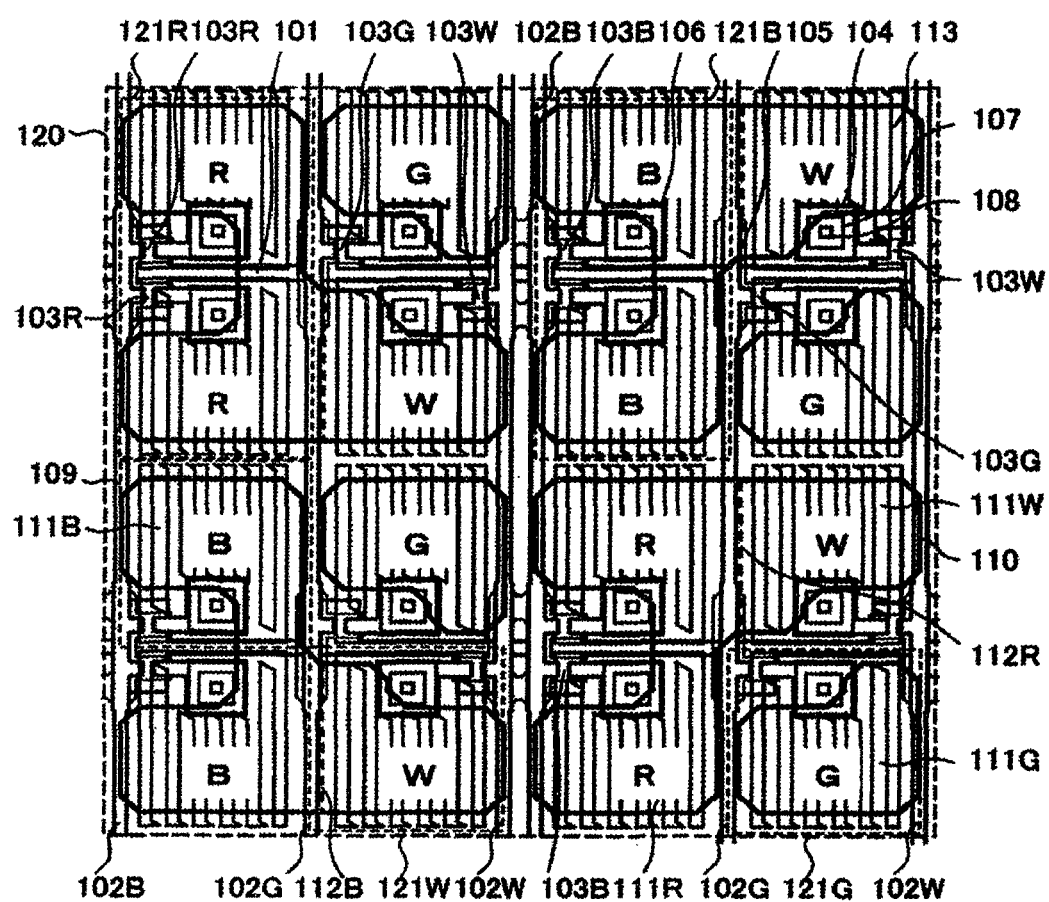
FIG. 1 is a diagram showing an enlarged partial plan view of a display device of an embodiment 1 of the present invention.

An explanation will be given of respective embodiments with reference to the accompanying figures of the drawing below.

Embodiment 1

A configuration of this embodiment will be described by use of FIG. 1. FIG. 1 is an enlarged plan view of part of a display device of this embodiment, including a plurality of picture elements or "pixels" in a display area with a matrix array of pixels each made up of sub-pixels being provided in units of colors. The display device of this embodiment is a liquid crystal display (LCD) device, which is arranged so that a liquid crystal (LC) layer is filled between a first substrate on which a plurality of thin-film transistors (TFTs) provided on a per-subpixel basis and wiring lines are disposed in a matrix form and a second substrate with color filters and a black matrix being disposed thereon. The LCD device is of the type using the so-called active matrix drive technique. Optical films, such as polarization plates, are bonded onto specified surfaces of the first and second substrates, which surfaces are on the opposite side to the LC layer. The display device of this embodiment is able to perform displaying with any given brightness or luminance by using a backlight module (not shown) as its light source and by electrically controlling the LC layer to modulate the polarization state of polarized light that has passed through the polarizer plate while also modulating the transmissivity of the other polarizer plate.

FIG. 1 shows an ensemble of unit arrangements 120 of pixels which are periodically disposed at substantially equal intervals, wherein each unit includes twelve subpixels in total—i.e., two red (R) subpixels 121R, two blue (B) subpixels 121B, four green (G) subpixels 121G and four white (W) subpixels 121W. Regarding the red (R) subpixels 121R and blue (B) subpixels 121B, each is further dividable into unit subpixels 109: the red (R) subpixels 121R and blue (B) subpixels 121B are each constituted from two unit subpixels. The longitudinal-to-lateral or "aspect" ratio of the red (R) subpixels 121R and blue (B) subpixels 121B is such that the longitudinal length is set to approximately two (2) with respect to the lateral length of one (1). On the contrary, the aspect ratio of the green (G) subpixels 121G and white (W) subpixels 121W is set at about 1:1. The green (G) subpixels 121G and white (W) subpixels 121W are such that each is formed of a single unit subpixel 109.

The red (R) subpixels 121R and blue (B) subpixels 121B are different in area from the green (G) subpixels 121G and white (W) subpixels 121W. The area of the former is approximately twice the area of the latter.

The reason for changing the number and area between the red (R) subpixels 121R and blue (B) subpixels 121B on one hand and the green (G) subpixels 121G and white (W) subpixels 121W on the other hand in this way is based on the relation of the visual sensitivity or luminosity and the image resolution. It is known that the human eyes are relatively higher in resolution of colors of high luminosity than other colors low in luminosity. In this embodiment, among the red (R), green (G), blue (B) and white (W) colors, the number of the G and W subpixels that are relatively high in luminosity is specifically set to about twice the number of the R and B subpixels that are relatively low in luminosity.

Figure 2:
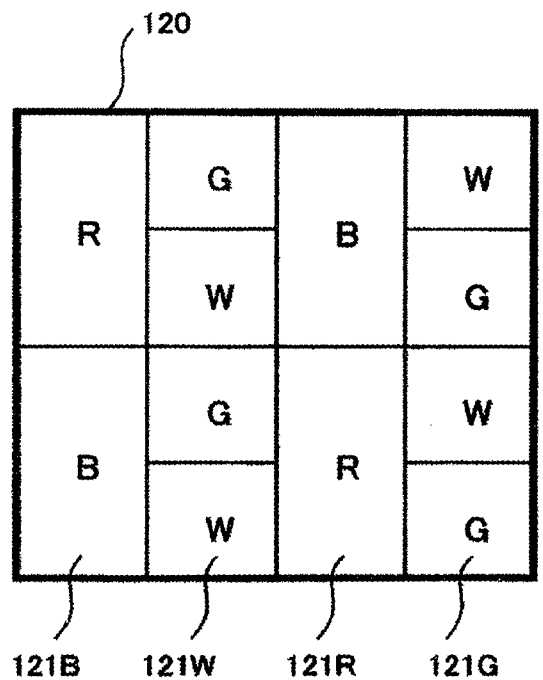
FIG. 2 is an explanation diagram of a pixel unit configuration of the embodiment 1 of this invention.
Figure 5:
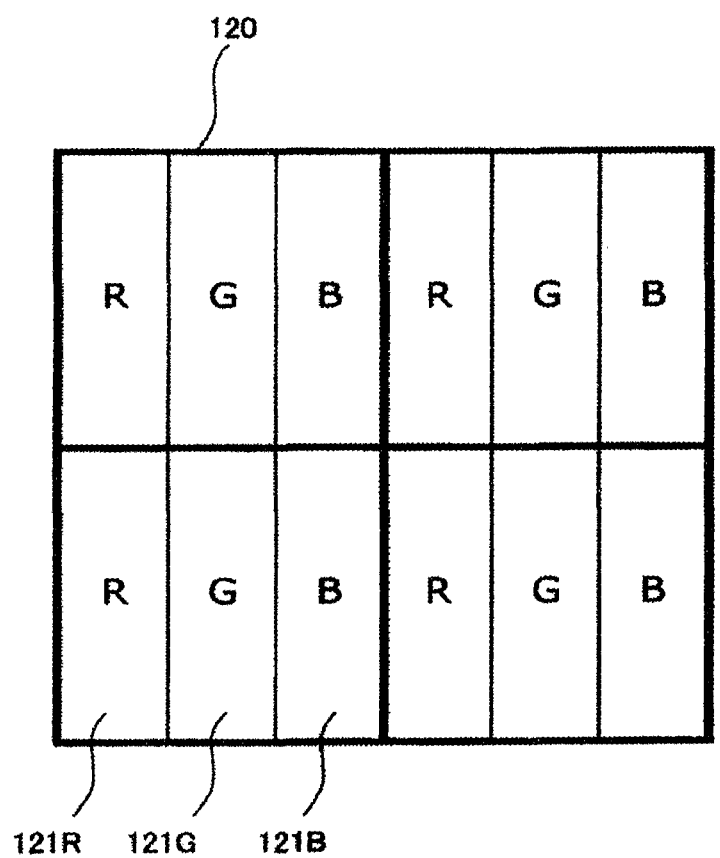
FIG. 5 is an explanation diagram of a layout of pixels which are equivalent in area to the embodiment 1 in prior known RGB parallel layout design.

See FIG. 2, which is a pictorial representation of the layout of respective subpixels in unit pixels. FIG. 5 is a pictorial representation of one prior art RGB parallel layout design having subpixel layouts which are equivalent in area to the pixel unit arrangements 120 of this embodiment shown in FIG. 2. In the prior art RGB parallel layout design, one pixel consists of three subpixels. FIG. 5 shows a total of twelve subpixels in a group of two rows and two columns of pixels. As apparent by comparison between FIG. 2 and FIG. 5, this embodiment is with addition of the white (W) subpixels 121W and, nevertheless, is kept identical in subpixel number in the same area—i.e., 12 subpixels. Whereas the number of the green (G) subpixels 121G and white (W) subpixels 121W is the same, the number of the green (G) subpixels 121G and blue (B) subpixels 121B is set at the half.

Figure 3:
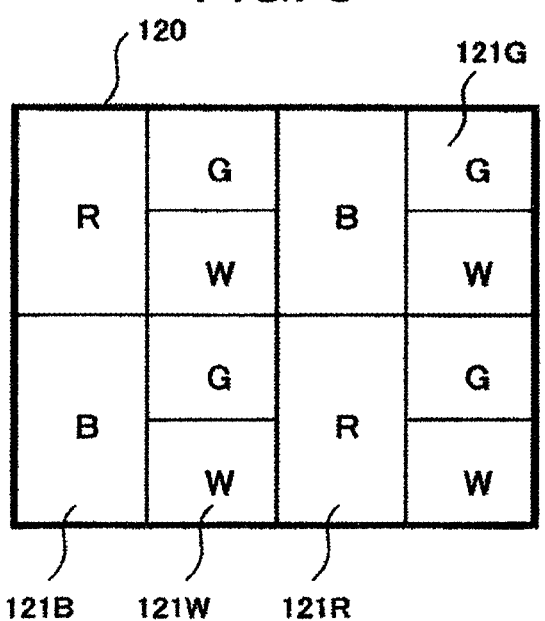
FIG. 3 is an explanation diagram of another example of the pixel unit configuration of the embodiment 1 of the invention.

A modified example of the subpixel layout scheme of FIG. 2 is shown in FIG. 3, wherein each pair of green (G) subpixel 121G and white (W) subpixel 121W is modifiable so that these are interchanged in position with each other.

A pixel is arranged to at least include a scan line 101, first signal line 102B, second signal line 102G, third signal line 102W, TFTs 103R, 103G, 103B and 103W, common electrode 104 (symbols in FIG. 1 indicate contact holes), amorphous silicon layer 105, and signal electrodes 106 and 113, which are formed on or above the first substrate, and also include a black matrix 110, red (R) color filter 111R, green (G) color filter 111G, blue (B) color filter 111B and white (W) color filter 111W, which are formed on the second substrate, and further includes an LC layer that is filled in the gap space provided between the first substrate and the second substrate. The black matrix 110 is for light shield purposes so it is opaque. In the drawing, this part is indicated by contour lines to avoid concealment of its background configurations. The red (R) color filter 111R, green (G) color filter 111G and blue (B) color filter 111B are each made of currently available color resist material. As for the white (W) color filter 111W, this filter may be formed by burying with a transparent resist material a step-like difference that was formed either by pre-removal of a color resist or by removing the color resist. The scan line 101, signal lines 102B, 102G and 102W, signal electrode 106 are each made of a metallic material of low electrical resistance. The common electrode 104 and signal electrode 113 are each formed of a transparent electrode. The signal electrode 106 and signal electrode 113 are connected via contact hole 107, 108. The LC layer is driven by an electric field being applied between the common electrode 104 and signal electrode 113. Although this embodiment uses amorphous silicon TFTs using amorphous silicon layer 105 in the TFTs 103, other types of transistors may alternatively be used, such as for example low-temperature polycrystalline silicon transistors, organic transistors, etc.

(Description as to Other Displays)

It would readily occur to those skilled in the art that the subpixel layout of this invention is applicable to display devices other than the LCD device stated in this embodiment. Examples of such devices include, but not limited to, organic LED panels, electrophoresis or electrochrominance-based electronic paper ("e-paper") display panels, PDPs, FED panels, and CRT monitors.

It is readily understandable that in display devices of the self-luminous type, such as organic LED panels and PDPs, the function of the color filter in the LCD device is achieved by per-color fluorescent material.

In the self-luminous display devices also, a technique is known for using white fluorescent material and color filters in a combined form to thereby perform color image displaying. In this case, it is possible to attain required designs by an approach similar to the LCD device of this embodiment.

(Details of Unit Subpixel)

The red (R) subpixels 121R and the blue (B) subpixels 121B are each formed of two unit subpixels 109 with TFTs 103 being connected to the same signal line for the reason which follows. Although the subpixels of this embodiment are different in size on a per-color basis, if each of the red (R) subpixels 121R and blue (B) subpixels 121B, which are relatively large-size subpixels, is not subdivided into unit subpixels 109, the area of an LC layer portion to be driven by the TFTs 103R and 103B is unintentionally different from that of each of the green (G) subpixels 121G and white (W) subpixels 121W. Accordingly, the significance of the so-called LC capacitance with the TFT 103's bearing LC layer portion as dielectric substance becomes different per color. Alternatively, if the subpixels are different in size on a per-color basis, the significance of parasitic capacitance between the signal electrode 113 and the signal line 102 becomes different on a per-color basis. In active matrix driving, the presence of the capacitance of TFT 103 per se and/or the parasitic capacitance thereof would result in a feed-through voltage being derived as an error of drive voltage. The feed-through voltage is variable in potential in a way depending upon the magnitude of the LC capacitance and/or parasitic capacitance. Consequently, if the LC capacitance and/or parasitic capacitance becomes different on a per-subpixel basis, the feed-through voltage also becomes different. If the feed-through voltage of each subpixel is kept constant, it is possible to alleviate the influence of feed-through voltage by amending a relative relation between common voltage potential and signal potential; however, such amendment is no longer executable in case the feed-through voltage is different per subpixel. For this reason, in this embodiment, larger subpixels are specifically arranged to be divided into unit subpixels, each of which is the same in size as smaller subpixels, to thereby ensure that each TFT 103's LC capacitance and parasitic capacitance become almost equal. With this arrangement, it is possible to sufficiently suppress the subpixel dependency of the feed-through voltage. This makes it possible to employ prior known feed-through voltage strategies with no changes even in arrangements with subpixels being different in area on a per-color basis.

(Explanation of Other Display Methods)

So far, this embodiment was described by mainly exemplifying LCD devices of the type using the active matrix (AM) drive technique, i.e., AM-LCDs, it is needless to say that the arrangement of this invention for dividing each of the larger subpixels into unit subpixels is applicable to other AM-driven display devices—for example, organic LED display devices, or electrophoresis/electrochrominance-based electronic paper (e-paper) display devices. This can be said because of the fact which follows. In the case of AM drive designs, the display image brightness deviation phenomenon per se is common—more precisely, when the capacitance of TFT 103 of each subpixel is varied, the feed-through voltage acting as noises varies accordingly, resulting in a display image being deviated from its intended level of brightness.

(Regarding Black Matrix)

Some major functions of the black matrix 110 are as follows: (1) preventing invasion of the outside light into TFTs 103, (2) shielding a region which can experience light leakage during black displaying due to a failure of prespecified movement of an LCD layer portion associated therewith, and (3) avoiding exposure of a color filter to its neighboring subpixel when misalignment occurs in the process of bonding together the first and second substrates. To attain the third goal, the black matrix is provided between R and G subpixels, between G and B subpixels and between R and B subpixels. An example is that in the case of displaying red (R) color that is high in chromaticity, only the red (R) subpixels 121R are driven to turn on while causing their adjacent green (G) subpixels 121G and blue (B) subpixels 121B to be kept deactivated and nonoperative. If the first and second substrates are misaligned in position, when any one of the green (G) subpixels 121G and blue (B) subpixels 121B partly overlaps its associated red (R) subpixel 121R, unwanted color mixture takes place. To avoid this risk, the black matrix is formed between the neighboring subpixels to ensure that such color mixture does not occur as far as the possible misalignment between the first and second substrates falls within a prespecified range. Unfortunately, this advantage of the black matrix layout does not come without accompanying a penalty: the black matrix partly shields the effective display area also, resulting in a likewise decrease in efficiency.

As a consequence, no black matrixes are provided between the W and B subpixels and between W and R subpixels. In view of the fact that it is low-chromaticity color that turns on the white (W) subpixels 121W, the blue (B) subpixels 121B and red (R) subpixels 121R are forced to turn on simultaneously. Accordingly, even when the red (R) subpixels 121R and blue (B) subpixels 121B slightly overlap white (W) subpixels 121W, the influence thereof is negligible. From this viewpoint, any black matrix is not provided at portions between W and B subpixels and between W and R subpixels. Note here that the boundary 112R of red (R) color filter in a region between W-R with no black matrix being provided therein is provided on the white (W) subpixel 121W side. Similarly, the boundary 112B of blue (B) color filter in a region between W-R with no black matrix being provided therein is provided on the white (W) subpixel 121W side. This is in order to prevent the invasion of white (W) color filter to the neighboring blue (B) subpixel 121B and red (R) subpixel 121R even when misalignment occurs in the process of bonding the first and second substrates together. With the black matrix layout unique to this embodiment, it is possible to recover and improve the efficiency, which was lowered due to the black-matrix shielding of effective display pixel areas.

In prior art color display devices of the type driving LC by similar principles to this embodiment, it is necessary to retain a predetermined distance between terminate ends of signal electrodes 113 of neighboring subpixels in order to avoid unwanted color mixture occurring due to the leakage of an electric field into such neighboring subpixels. From a viewpoint of efficiency improvement, this distance is too long slightly. The reason of this is that if the distance between the terminate ends of signal line 102 and signal electrode 113 is long excessively then it becomes difficult to efficiently drive a region therebetween. In this embodiment, there is a portion between subpixels in which two signal lines 102B and 102W are disposed: at this portion, a sufficient length of distance is acquirable between neighboring subpixels at the end of signal electrode 113. Accordingly, the distance between the end of signal electrode 113 of a subpixel neighboring upon two signal lines 102B and 102W and the signal line 102B, 102W is specifically designed to be shorter than the distance between the signal electrode 113's end of a subpixel adjacent to one signal line 102G and this signal line 102G.

The black matrix layout of this arrangement may also be applied to other color filter layout designs.

Figure 4:
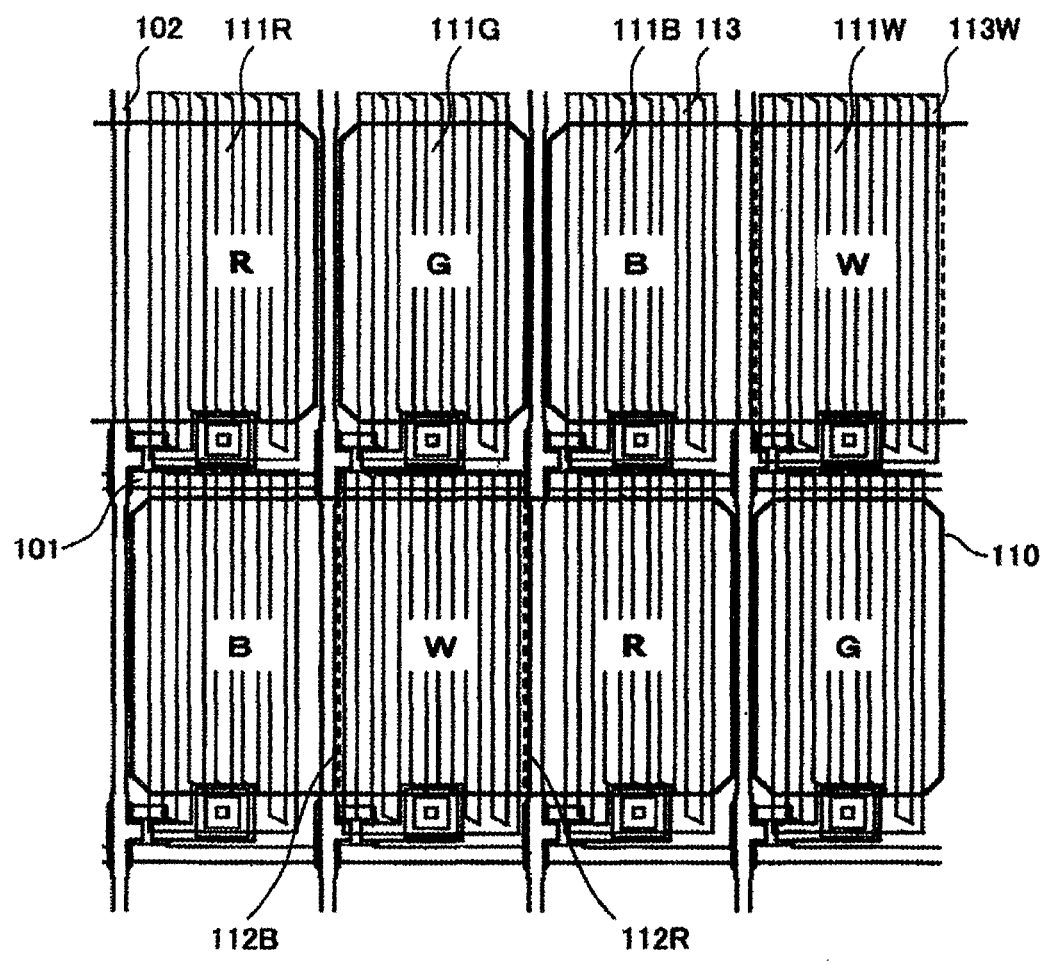
FIG. 4 is an explanation diagram of an application example of a black matrix layout method of the invention.

See FIG. 4, which is an explanation diagram in the case of the black matrix layout of this embodiment being applied to a color filter layout which is disclosed in US 2005/0225575. A black matrix 110 is provided between green (G) and red (R) subpixels and between green (G) and blue (B) subpixels in order to prevent color mixture otherwise occurring due to the presence of substrate-bonding misalignment whereas the black matrix 110 is not provided on the right and left sides of each white (W) subpixel.

In addition, the color filter boundary 112B of a blue (B) subpixel is provided at a position nearer to its associated white (W) subpixel than signal line 102; similarly, the color filter boundary 112R of a red (R) subpixel is provided at a position nearer to the white (W) subpixel than signal line 102. This is in order to prevent invasion of the color filter of white (W) subpixel into blue (B) and red (R) subpixels even upon occurrence of substrate bond misalignment. Comb teeth of signal electrode 113 of white (W) subpixel 121W are arranged to be greater in number than comb teeth of signal electrode 113 of those subpixels of the other colors. It is needed to retain a prespecified length of distance between the terminate ends of signal electrodes 113 of neighboring subpixels in order to prevent color mixture occurring due to leakage of an electric field to such neighboring subpixels.

However, from the viewpoint of efficiency, this distance is too long by little. In the case of an arrangement with white (W) subpixels being provided in addition to those subpixels of the three primary colors, the white (W) subpixels are sometimes turned off during turn-on driving of red (R) subpixels and blue (B) subpixels; adversely, in the case of the white (W) subpixels being turned on, the red (R) subpixels and blue (B) subpixels are driven to turn on simultaneously so that there is no need to worry about the occurrence of color mixture due to leakage of an electric field of at the end of signal electrode 113W of white (W) subpixel to its neighboring subpixels. Accordingly, unlike the subpixels of the three primary colors, the white (W) subpixels are arranged to increase in number of comb teeth of signal electrode 113W to thereby make the distance between the end of signal electrode 113 and signal line 102 shorter than the distance between end of signal electrode 113 and signal line 102 in the subpixels of three primary colors.

Embodiment 2

Regarding peripheral circuit design in a case where the unit subpixel configuration is not employed, this embodiment provides a solution to problems occurrable in the pixel layouts shown in FIGS. 2 and 3 when failing to use the unit subpixel arrangement and thus resulting in the subpixels being different in size on a per-color basis, which solution is different from that of the embodiment 1. One problem occurring in case the subpixels are different in size on a per-color basis is that the optimum common voltage becomes different in its potential value due to a difference of feed-through voltage on a per-subpixel basis, which can occur due to differences of each subpixel's electrical characteristics (e.g., retained capacitance, parasitic capacitance or else). Size-different subpixels will be referred to as a first kind of subpixel and second kind of subpixel, respectively. A method for supplying color-tone or gradation voltages which are optimized to the first kind of subpixel and second kind of subpixel, which are different in size from each other, will be explained with reference to FIGS. 6A and 6B. In this embodiment, an explanation will be given of a case where green (G) subpixels and white (W) subpixels are each regarded as the first kind of subpixel whereas red (R) subpixels and blue (B) subpixels are each assumed to be the second kind of subpixel.

Figure 6A:
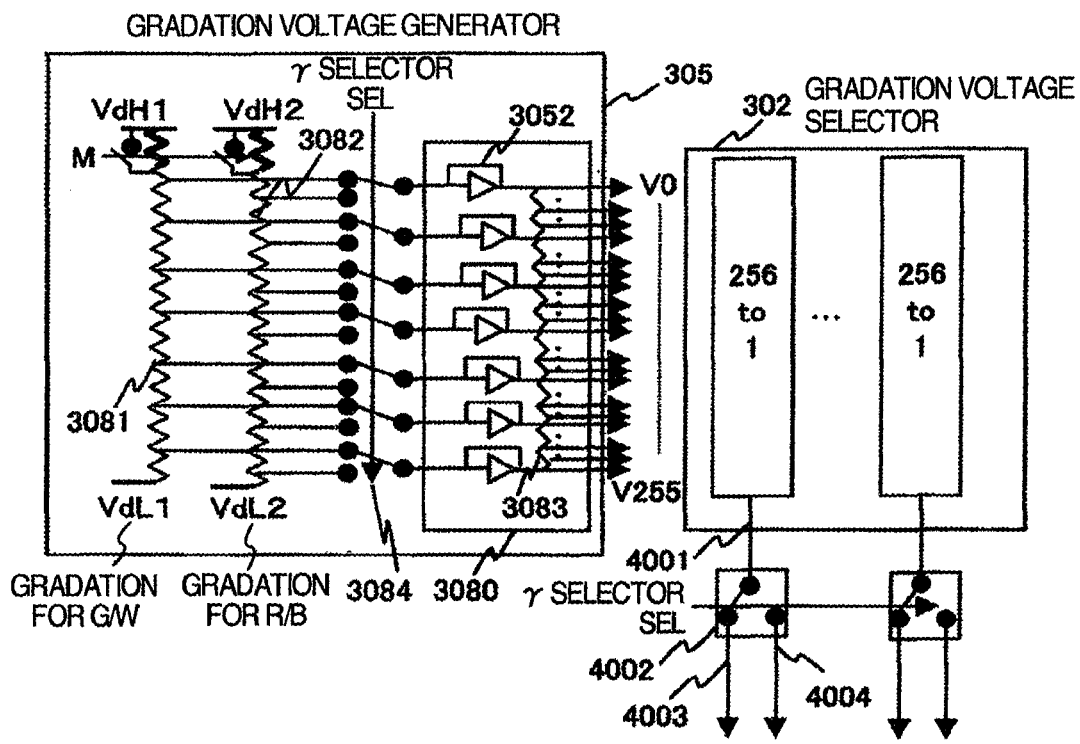
FIGS. 6A and 6B are diagrams for explanation of a gradation voltage generator and a gradation voltage selector in signal line drive circuitry.
Figure 6B:
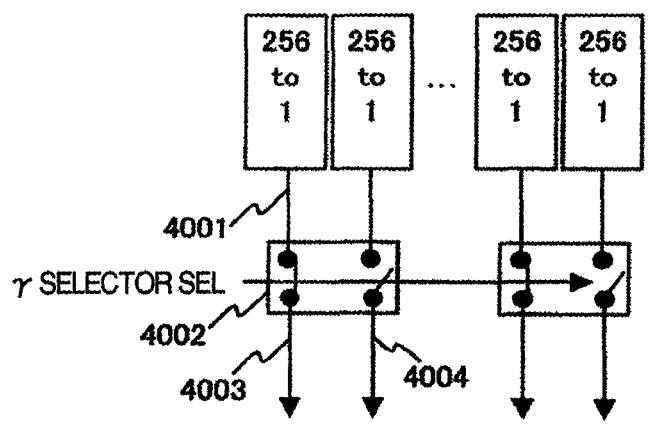

FIG. 6A is a schematic diagram of a circuit arrangement embodying the invention. A gradation voltage generation unit 305 supplies 256 gradation voltages V0 to V255 to a gradation voltage selector 302. This gradation voltage selector selects from among the 256 gradation voltages a gradation voltage corresponding to image data and then outputs it to an image data output terminal 4001. A selector switch 4002 is responsive to receipt of a signal SEL for connecting the image data output terminal 4001 to either a signal transfer line 4003 that is connected to green (G) and white (W) subpixels or a signal line 4004 that is connected to red (R) and blue (B) subpixels. In FIG. 6A, the case is shown where the selector switch 4002 is fabricated on an LCD panel: in this case, a number of image data output terminals 4001 is one-half of the number of signal lines. For example, it is also conceivable that as shown in FIG. 6B, the selector switch 4002 is formed within a signal line drive circuit with the image data output terminals 4001 being equal in number to the signal lines.

The gradation voltage generator 305 includes an output stage 3080 which consists essentially of operation amplifiers 3052 that perform current amplification and string resistors 3083 for increasing the number of color tones, a first ladder resistor 3081 which generates a reference voltage of first gradation voltage, a second ladder resistor 3082 that generates a reference voltage of second gradation voltage, and a reference voltage changeover switch module 3084 for performing, in sync with the signal SEL, switching between voltages to be output from the first ladder resistor and the second ladder resistor and for outputting a switched voltage to more than one of the op-amps 3052. In this embodiment, there is also provided a switch module for controlling each ladder resistor in response to receipt of a polarity-inverted signal M that is in sync with a polarity inversion period of liquid crystal (LC). With this switch, the ladder(s) is/are varied in resistance value in a way synchronized with the polarity inversion also. This configuration is the one that supplies a signal line(s) with the first gradation voltage and second gradation voltage by causing the two types of ladder resistors to produce at least two different kinds of reference voltages and then performing switching of these voltages in response to the signal SEL to thereby input it to the opamp(s) 3052.

Other employable arrangements include an arrangement with the two ladder resistors being replaced by a single ladder resistor capable of changing its resistance value in a time-division manner, thereby enabling the first gradation voltage and second gradation voltage to be supplied to signal lines in a time-division way, and an arrangement with the string resistor being modified to be controlled in a time division fashion.

Figure 7:
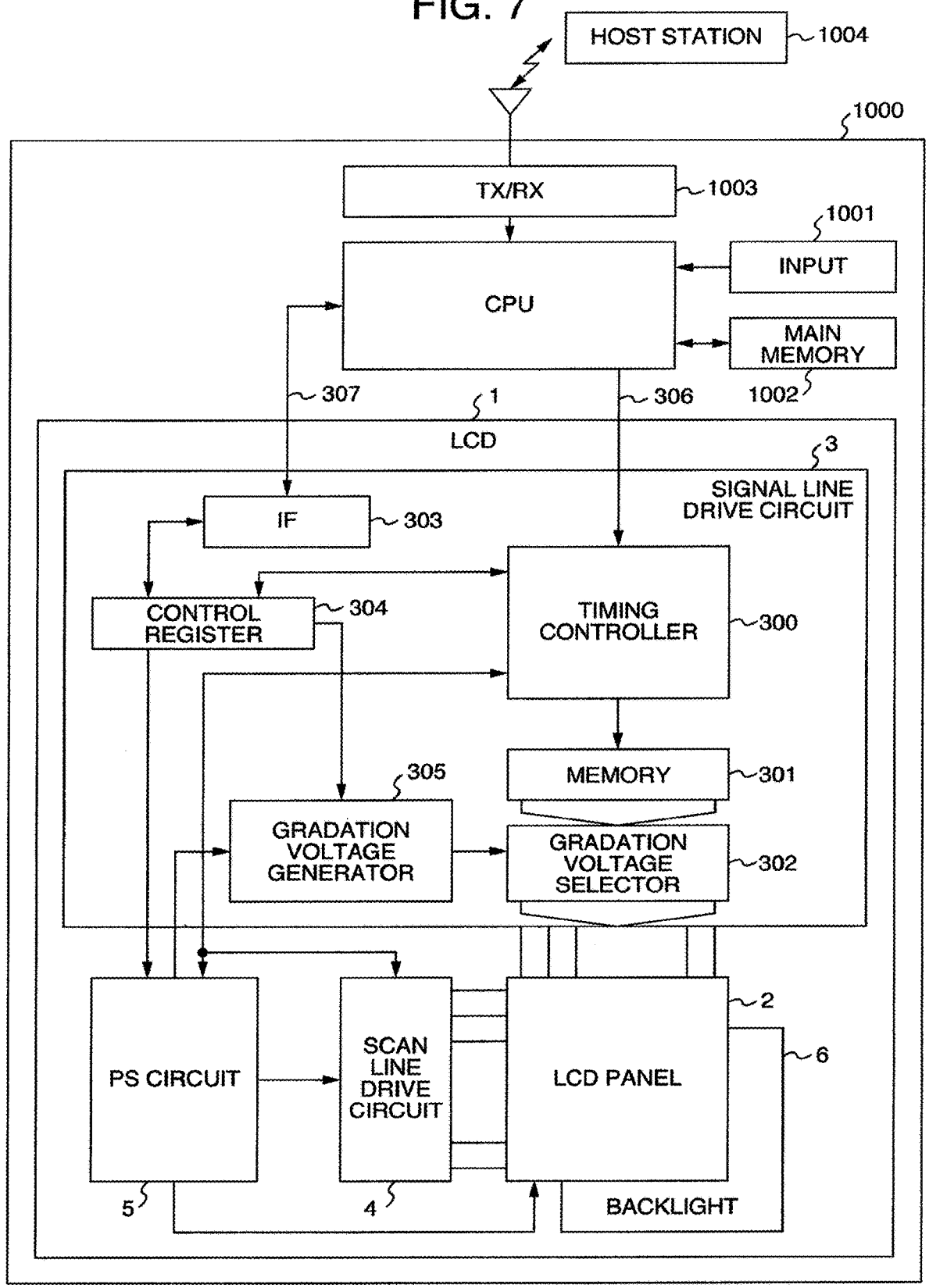
FIG. 7 is an explanation diagram of a cellular phone system.

FIG. 7 shows a circuit configuration of a cellular or "mobile" phone incorporating the principles of this invention. This mobile phone is designated by numeral 1000 in FIG. 7, which is wirelessly communicable over-the-air with a host station 1004. Mobile phone 1000 is generally made up of an input means 1001, main memory 1002, transmission/reception (Tx/Rx) unit 1003, central processor unit (CPU), and LCD device 1. This LCD device includes as its major components an LCD panel 2, signal line drive circuit 3, scan line drive circuit 4, power supply (PS) circuit 5, and backlight unit 6. The signal line drive circuit 3 includes a timing control circuit 300, memory 301, gradation voltage selector 302, interface (IF) 303, control register 304, and gradation voltage generator 305.

The CPU of mobile phone 1000 performs various kinds of control operations of the phone. Concerning the control of the LCD device 1, it outputs a display sync signal and image data 306 to the timing controller 300, thereby enabling visual displaying of information received from the host station 1004 and/or the data stored in the main memory 1002. In addition, it issues operation-defining data 307 (in this embodiment, this data will be called the instruction). The IF 303 performs transmission and reception of data containing therein the instruction to and from the CPU. In addition, the control register 304 also performs such data receive/transmit operations. The instruction will be stored in the control register 304.

The signal line drive circuit 3 drives signal lines 101 whereas the scan line drive circuit 4 drives scan lines 102. The PS circuit 5 produces from a voltage fed from the mobile phone an appropriate potential level of power supply voltage, which is supplied to the signal line drive circuit 3 and scan line drive circuit 4. PS circuit 105 also has a built-in circuit for driving an opposing electrode, also known as "counter" electrode.

The timing controller 300 reads image data out of the memory 301 and then sequentially outputs the image data to the gradation voltage selector 302 in a way of one row of image data in unison at a time. The gradation voltage selector 302 selects one from among the gradation voltages generated by the gradation voltage generator 305 and then applies it to each signal line. The gradation voltage generator 305 functions to generate all possible gradation voltages, which correspond in number to all the color tone levels required—for example, 64 different voltages in case the number of gradation levels required is 64.

Embodiment 3

(RGBC Layout)

Figure 8:
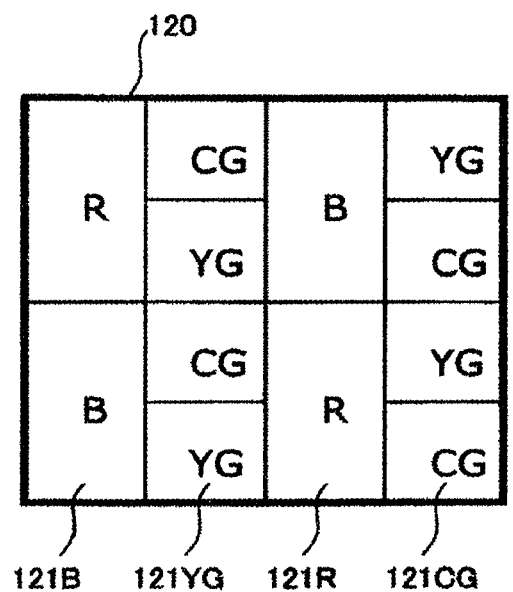
FIG. 8 is an explanation diagram of a pixel unit arrangement of an embodiment 3 of the invention.
Figure 9:
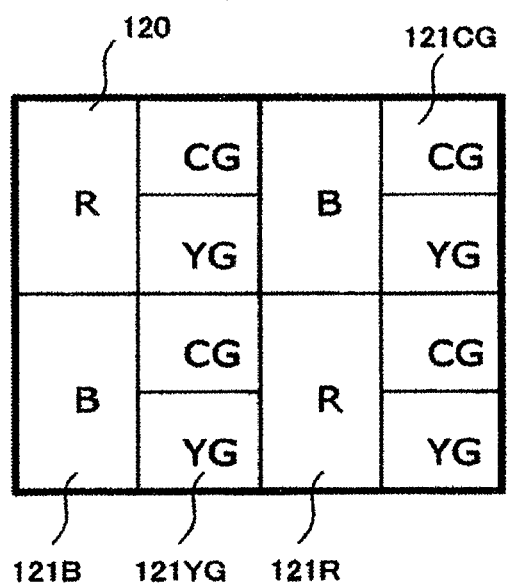
FIG. 9 is an explanation diagram of another example of the unit pixel arrangement of the embodiment 3 of the invention.

In this embodiment, a description will be given of another configuration of color filters in the subpixel layouts shown in FIGS. 2 and 3. While the embodiments shown in FIGS. 2-3 are each arranged to have white (W) subpixels in addition to the subpixels of three primary colors, i.e., red (R), green (G) and blue (B), this arrangement may be modified so that the green (G) and white (W) subpixels which are higher in visual sensitivity than red (R) and blue (B) subpixels are replaced by subpixels of blue-blended green (CG) and yellow-blended green (YG) which are similarly high in visual sensitivity to thereby provide a configuration of four primary colors as shown in FIGS. 8 and 9. An advantage of this arrangement lies in its ability to widen the range of color reproduction when compared to the case of using only three primary colors, i.e., red (R), green (G) and blue (B). Very importantly, the advantage as to expandability of the color reproduction range is obtainable without having to increase the signal lines and scan lines in number when compared to prior art pixel configurations using only the three primary colors of red (R), green (G) and blue (B). Thus it is possible to appreciably increase aperture ratios when compared to an arrangement with parallel layout of size-equaled subpixels of four primary colors. This makes it possible to achieve a display device capable of offering increased efficiency and enhanced color reproducibility.

Embodiment 4

(Case of Semi-Transmissive Display)

Figure 10:
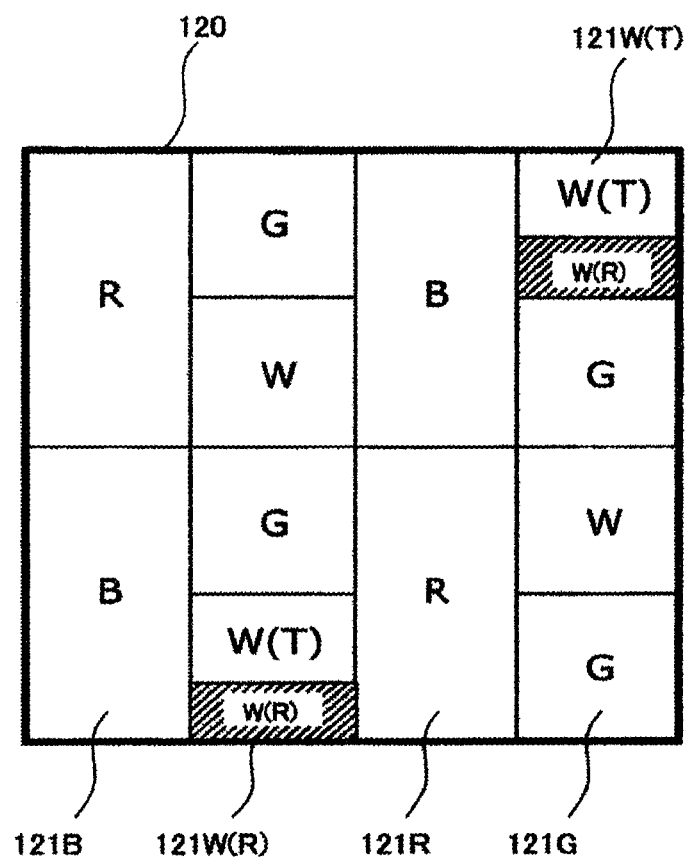
FIG. 10 is an explanation diagram of a pixel unit configuration of an embodiment 4 of the invention.
Figure 11:
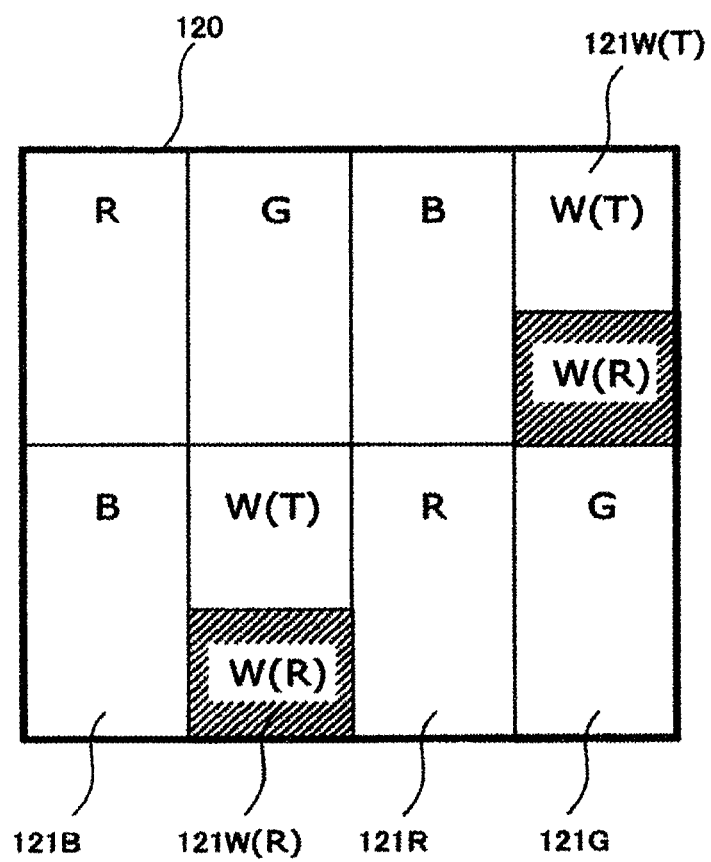
FIG. 11 is an explanation diagram of another example of the unit pixel configuration of the embodiment 4 of the invention.
Figure 12:
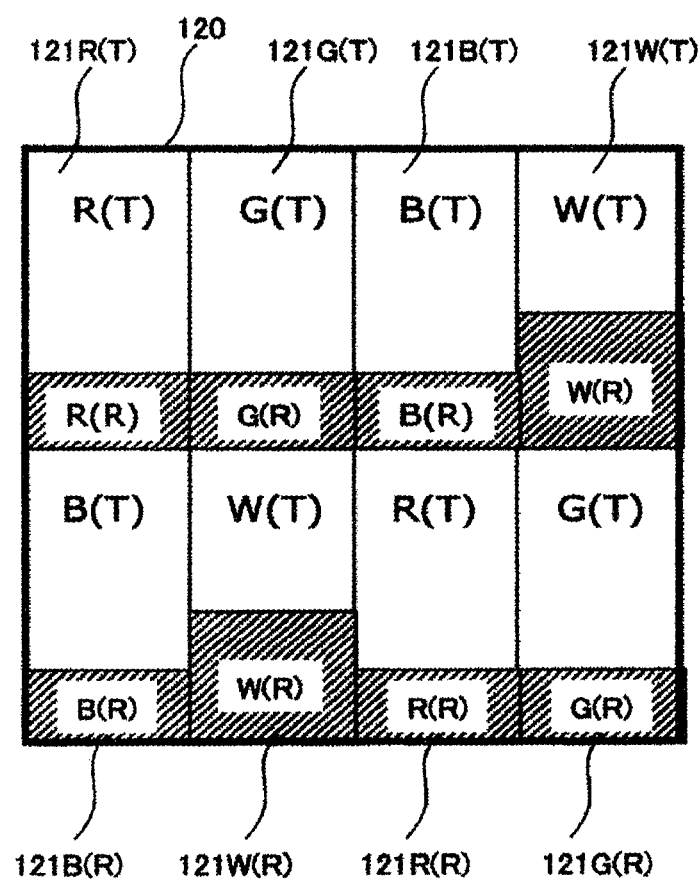
FIG. 12 is an explanation diagram of still another example of the unit pixel configuration of the embodiment 4 of the invention.

This embodiment is drawn to a semi-transmissive LCD device, also known as transreflective LCD, which has subpixels each of which is constituted from a transmissive part and a reflective part. Prior art transflective LCD devices using subpixels of only three primary colors, i.e., red (R), green (G) and blue (B), are usually arranged to partly remove a color filter at the reflective part and provide a white-colored area within a subpixel. In cases where it is acceptable to perform image displaying in a black-and-white mode, another configuration is employable in a way such that reflective part 121W(R) is provided only in white (W) subpixels as shown in FIGS. 10 and 11. Still alternatively, as shown in FIG. 12, every subpixel may be designed to have reflective parts 121B(R), 121G(R), 121R(R) and 121W(R) to thereby provide the transflective display specification, thus causing the reflective part's area ratio to change so that it is different between for white (W) subpixels and for the other subpixels.

An expected advantage obtainable in any one of these cases is as follows: the reflective part is higher in the ratio of white (W) area than the transmissive part, resulting in a decrease in the color reproduction range even at the reflective part, thereby enabling enhancement of the reflectivity thereof. When viewed from another standpoint, it can be said that this arrangement is such that only the white (W) subpixels are arranged to be low in area ratio of transmissive part. Adding the white (W) subpixels contributes to improvements in brightness. However, this merit does not come without accompanying risks: a relative decrease in area ratio of primary colors, and an increase in brightness ratio of primary colors to white. By lessening the aperture ratio of transmissive part of white (W) subpixels less when compared to aperture ratios of three primary colors, it becomes possible to make smaller or "alleviate" the ratio of the brightness during displaying the white color versus the brightness during displaying the three primary colors.

This invention provides a successful solution for improvement of the viewability of LCD devices adaptable for use in information terminal equipment typically, cellular phones.

It should be further understood by those skilled in the art that although the foregoing description has been made on embodiments of the invention, the invention is not limited thereto and various changes and modifications may be made without departing from the spirit of the invention and the scope of the appended claims.

What is claimed is:

1. A color display device comprising:
an array of a plurality of sub-pixels, including red sub-pixels, blue sub-pixels, and green sub-pixels; and
a green pixel border between two adjacent green sub-pixels;
wherein
a size of the green sub-pixels is smaller than that of the red sub-pixels or the blue sub-pixels,
the two adjacent green sub-pixels are arranged in a first direction,
the green pixel border is provided on a straight line connecting a center of a red sub-pixel and a center of a blue sub-pixel that are adjacent to each other and that are arranged in a second direction intersected with the first direction,
the green pixel border is surrounded by the two adjacent green sub-pixels, the red sub-pixel and the blue sub-pixel,
the green pixel border does not overlap the two adjacent green sub-pixels,
the center of the red sub-pixel is a light-output region of the red sub-pixel, and
the center of the blue sub-pixel is a light-output region of the blue sub-pixel.

2. The color display device according to claim 1, wherein two adjacent red sub-pixels are arranged in a third direction which has an angle with the first direction and the second direction, and
one of the two adjacent green sub-pixels is provided between the two adjacent red sub-pixels which are arranged in the third direction.

3. The color display device according to claim 1, wherein two adjacent blue sub-pixels are arranged in a fourth direction which has an angle with the first direction and the second direction, and
one of the two adjacent green sub-pixels is provided between the two adjacent blue sub-pixels which are arranged in the fourth direction.

4. The color display device according to claim 1, wherein two adjacent red sub-pixels are arranged in a third direction which has an angle with the first direction and the second direction,
two adjacent blue sub-pixels are arranged in a fourth direction which has an angle with the first direction and the second direction and different from the third direction, and
one of the two adjacent green sub-pixels is provided between the two adjacent red sub-pixels which are arranged in the third direction and the two adjacent blue sub-pixels which are arranged in the fourth direction.

5. A color display device comprising:
an array of a plurality of sub-pixels including red sub-pixels, blue sub-pixels, and green sub-pixels; and
a green pixel border between two adjacent green sub-pixels;
wherein
each of the sub-pixels includes a thin-film transistor,
a gate of the thin-film transistor is electrically connected to a gate signal line,
the gate signal line which is electrically connected to the gate of the blue sub-pixel intersects the blue sub-pixel,
the two adjacent green sub-pixels are arranged in a first direction, the green pixel border is provided on a straight line connecting a center of a red sub-pixel and a center of a blue sub-pixel that are adjacent to each other and that are arranged in a second direction intersected with the first direction, the green pixel border is surrounded by the two adjacent green sub-pixels, the red sub-pixel and the blue sub-pixel, the green pixel border does not overlap the two adjacent green sub-pixels, the center of the red sub-pixel is a light-output region of the red sub-pixel, and the center of the blue sub-pixel is a light-output region of the blue sub-pixel.

6. The color display device according to claim 5, wherein two adjacent red sub-pixels are arranged in a third direction which has an angle with the first direction and the second direction, and one of the two adjacent green sub-pixels is provided between the two adjacent red sub-pixels which are arranged in the third direction.

7. The color display device according to claim 5, wherein two adjacent blue sub-pixels are arranged in a fourth direction which has an angle with the first direction and the second direction, and one of the two adjacent green sub-pixels is provided between the two adjacent blue sub-pixels which are arranged in the fourth direction.

8. The color display device according to claim 5, wherein two adjacent red sub-pixels are arranged in a third direction which has an angle with the first direction and the second direction, two adjacent blue sub-pixels are arranged in a fourth direction which has an angle with the first direction and the second direction and different from the third direction, and one of the two adjacent green sub-pixels is provided between the two adjacent red sub-pixels which are arranged in the third direction and the two adjacent blue sub-pixels which are arranged in the fourth direction.

9. A color display device comprising:

an array of a plurality of sub-pixels including red sub-pixels, blue sub-pixels, and green sub-pixels;

a green pixel border between two adjacent green sub-pixels;

each of the sub-pixels include a thin-film transistor; and a gate of the thin-film transistor is electrically connected to a gate signal line, wherein the gate signal line which is electrically connected to the gate of the red sub-pixel intersects the red sub-pixel, a size of the green sub-pixels is smaller than that of the red sub-pixels or the blue sub-pixels, the two adjacent green sub-pixels and the green pixel border are arranged in a first direction, and the green pixel border is provided on a straight line connecting a center of a red sub-pixel and a center of a blue sub-pixel that are adjacent to each other and are arranged in a second direction intersected with the first direction, the green pixel border is surrounded by the two adjacent green sub-pixels, the red sub-pixel and the blue sub-pixel, the green pixel border does not overlap the two adjacent green sub-pixels, the center of the red sub-pixel is a light-output region of the red sub-pixel, and the center of the blue sub-pixel is a light-output region of the blue sub-pixel.

10. The color display device according to claim 9, wherein two adjacent red sub-pixels are arranged in a third direction which has an angle with the first direction and the second direction, and one of the two adjacent green sub-pixels is provided between the two adjacent red sub-pixels which are arranged in the third direction.

11. The color display device according to claim 9, wherein two adjacent blue sub-pixels are arranged in a fourth direction which has an angle with the first direction and the second direction, and one of the two adjacent green sub-pixels is provided between the two adjacent blue sub-pixels which are arranged in the fourth direction.

12. The color display device according to claim 9, wherein two adjacent red sub-pixels are arranged in a third direction which has an angle with the first direction and the second direction, two adjacent blue sub-pixels are arranged in a fourth direction which has an angle with the first direction and the second direction and different from the third direction, and one of the two adjacent green sub-pixels is provided between the two adjacent red sub-pixels which are arranged in the third direction and the two adjacent blue sub-pixels which are arranged in the fourth direction.

* * * * *